(12) United States Patent
Ohira et al.

(10) Patent No.: US 7,351,757 B2
(45) Date of Patent: Apr. 1, 2008

(54) VIBRATION-DAMPING ENGINEERING PLASTICS

(75) Inventors: Yasuyuki Ohira, Gifu (JP); Tatsuya Aoki, Gifu (JP)

(73) Assignee: Shishiai-Kabushikigaisha, Gifu (JP)

( * ) Notice: Subject to any disclaimer, the term of this patent is extended or adjusted under 35 U.S.C. 154(b) by 136 days.

(21) Appl. No.: 11/145,083

(22) Filed: Jun. 3, 2005

(65) Prior Publication Data

US 2005/0222306 A1 Oct. 6, 2005

Related U.S. Application Data

(63) Continuation of application No. PCT/JP02/013104, filed on Dec. 13, 2002.

(51) Int. Cl.
*C08K 5/34* (2006.01)
*C08K 5/46* (2006.01)
(52) U.S. Cl. .................. 524/83; 524/91; 524/299; 524/359
(58) Field of Classification Search ............. 524/83, 524/91, 299, 359
See application file for complete search history.

(56) References Cited

U.S. PATENT DOCUMENTS 5,206,301 A * 4/1993 Hattori et al. ............... 525/314
5,695,867 A * 12/1997 Saitoh et al. ............... 428/219
6,503,974 B1 * 1/2003 Ogasawara et al. ......... 524/495
2002/0037381 A1 * 3/2002 Ohira et al. ............... 428/36.9

FOREIGN PATENT DOCUMENTS

| JP | 2001072777 | * | 3/2001 |
| JP | 2002-179908 A | | 6/2002 |
| JP | 2002-179927 A | | 6/2002 |
| WO | WO 00/08100 A1 | | 2/2000 |
| WO | WO 00/36022 A1 | | 6/2000 |
| WO | WO 00/36023 A1 | | 6/2000 |
| WO | WO 00/36044 A1 | | 6/2000 |

* cited by examiner

*Primary Examiner*—Kriellion A Sanders
(74) *Attorney, Agent, or Firm*—Adams Intellectual Property Law, P.A.

(57) ABSTRACT

The invention relates to vibration-damping engineering plastics which can be used in a wide variety of fields such as electronic equipments, electronic materials, household appliances, automobile/other transport instruments, industrial machine parts, precision instruments, building materials, sporting/leisure goods, and articles for daily use, and which includes thermoplastic engineering plastics as a base polymer and an organic vibration-damping agent incorporated into the base polymer, the organic vibration damping agent has one or more members selected from a compound having a benzothiazyl group, a compound having a benzotriazole group, a compound having a diphenyl acrylate group and a compound having a benzophenone group.

2 Claims, 3 Drawing Sheets

US 7,351,757 B2

VIBRATION-DAMPING ENGINEERING PLASTICS

This is a continuation application of PCT/JP2002/013105 filed on Dec. 13, 2002.

TECHNICAL FIELD AND BACKGROUND OF THE INVENTION

The present invention relates to vibration-damping engineering plastics which can be used in a wide variety of fields such as electronic equipments, electronic materials, household appliances, automobile/other transport instruments, industrial machine parts, precision instruments, building materials, sporting/leisure goods, and articles for daily use. Specifically, the present invention relates to vibration-damping engineering plastics having both high strength and excellent vibration-damping properties.

BACKGROUND ART

Engineering plastics are known as plastics having a heat resistance of 100° C. or more, a strength of 49.0 MPa or more, and a modulus of elasticity in bending of 2.4 GPa or more. The engineering plastics having such properties are used in a wide variety of fields, for example electronic equipments such as a cellular phone housing, a compact disk, a computer and a printer, electronic materials such as a circuit board, a print substrate, a CPU panel and an IC chip, household appliances such as a ventilation fan, a vacuum cleaner, a washing machine and a refrigerator, automobile/other transport instruments such as an instrument panel, an airbag cover, an airbag, a console box, a steering part, an electric part and a bumper, industrial machine parts such as a cum and a gear, precision instruments such as a stereo, a video tape player and a video camera, building materials such as an asphalt modifier, an eaves trough and a unit bath, sporting/leisure goods such as a golf head, a surfboard, ski goods, a snowboard, a fishing tool and a helmet, and articles for daily use such as a container and a joint.

Among these applications where the engineering plastics are used, applications to household appliances such as a washing machine and a vacuum cleaner or automobile parts such as an instrument panel, there is a need for functions of damping vibrations spreading to the outside.

In applications to precision instruments such as a stereo, a video tape player and a video camera and electronic equipments such as a printer, on the other hand, there is a need for functions of damping vibrations spreading to the inside of the instruments.

For such needs, vibration-damping measures such as attachment of a vibration-damping material or a vibration-deadening material to an engineering plastics product have been taken. Vibration-damping engineering plastics comprising thermosetting engineering plastics (e.g. unsaturated polyester) as a matrix polymer into which inorganic fillers such as ferrite were filled have also recently been proposed.

With respect to the engineering plastics product having a rubber sheet attached thereto, however, its adhesion operation is complicated, and depending on working conditions, there occurs the inconvenience of separation of the rubber sheet from the engineering plastics product. On the other hand, the vibration-damping engineering plastics filled with ferrite etc. are poor in vibration-damping properties, and have the problem of failure to take sufficient vibration measures. In addition, the conventional vibration-damping engineering plastics do not attain sufficient vibration-damping properties in a working temperature range.

SUMMARY OF THE INVENTION

The present invention was made in view of these circumstances, and a first object of the present invention is to provide vibration-damping engineering plastics having high strength and excellent vibration-damping properties, which can be used in a wide variety of applications.

A second object of the present invention is to provide vibration-damping engineering plastics usable in a wide temperature range and having excellent vibration-damping properties in the temperature range.

A third object of the present invention is to provide vibration-damping engineering plastics having excellent vibration-damping properties in a working temperature range depending on applications, by combining plurality kinds of organic vibration-damping agents.

To solve these objects, the gist of the present invention lies in vibration-damping engineering plastics comprising thermoplastic engineering plastics as a base polymer and an organic vibration-damping agent incorporated into the base polymer, the organic vibration-damping agent consisting of one or more members selected from a compound having a benzothiazyl group, a compound having a benzotriazole group, a compound having a diphenyl acrylate group and a compound having a benzophenone group.

The organic vibration-damping agent in the vibration-damping engineering plastics is contained desirably in a ratio of 1-300 parts by weight to 100 parts by weight of the base polymer consisting of thermoplastic engineering plastics.

BEST MODE FOR CARRYING OUT THE INVENTION

Hereinafter, the vibration-damping engineering plastics of the present invention are described in more detail. The vibration-damping engineering plastics of the present invention comprise thermoplastic engineering plastics as abase polymer and an organic vibration-damping agent incorporated into the base polymer.

As the thermoplastic engineering plastics in the vibration-damping engineering plastics of the present invention, mention can be made of one or more members selected from the group consisting of poyacetal (POM), polyamide (PA), polybutylene terephthalate (PBT), polyethylene terephthalate (PET), syndiotactic polystyrene (SPS), polyphenylene sulfide (PPS), polyether ether ketone (PEEK), liquid crystalline polymer (LCP), fluorene resin, polyether nitrile (PEN), polycarbonate (PC), modified polyphenylene ether (mPPE), polysulfone (PSF), polyether sulfone (PES), polyarylate (PAR), polyamide imide (PAI), polyether imide (PEI) and thermoplastic polyimide (PI).

Among the thermoplastic engineering plastics, crystalline polymers that is, polyacetal (POM), polyamide (PA), polybutylene terephthalate (PBT), polyethylene terephthalate (PET), syndiotactic polystyrene (SPS), polyphenylene sulfide (PPS), polyether ether ketone (PEEK), liquid crystalline polymer (LCP), fluorine resin and polyether nitrile (PEN) are more preferable in respect of superiority in mechanical properties.

Among the thermoplastic engineeringplastics, polyacetal (POM) is extremely superior in fatigue resistance. POM is more preferable because it is also superior in resistance to abrasion/wear, low noise, chemical resistance, creep resistance and dimensional stability.

It cannot be said that the base polymer itself is satisfactory in vibration-damping performance (tan5). Accordingly, the vibration-damping engineering plastics of the present invention comprise an organic vibration-damping agent incorporated into the base polymer. By incorporating the organic vibration-damping agent into the base polymer, the vibration-damping performance (tanS) of the vibration-damping engineering plastics is significantly improved. That is, the vibration-damping engineering plastics, upon application to uses requiring vibration-damping performance (tanS), serve as vibration-damping engineering plastics not only achieving sufficient performance but also usable in a wide temperature range and superior in vibration-damping properties (tanS) in that temperature range, as shown in FIGS. 1 to 3.

Figure 1:
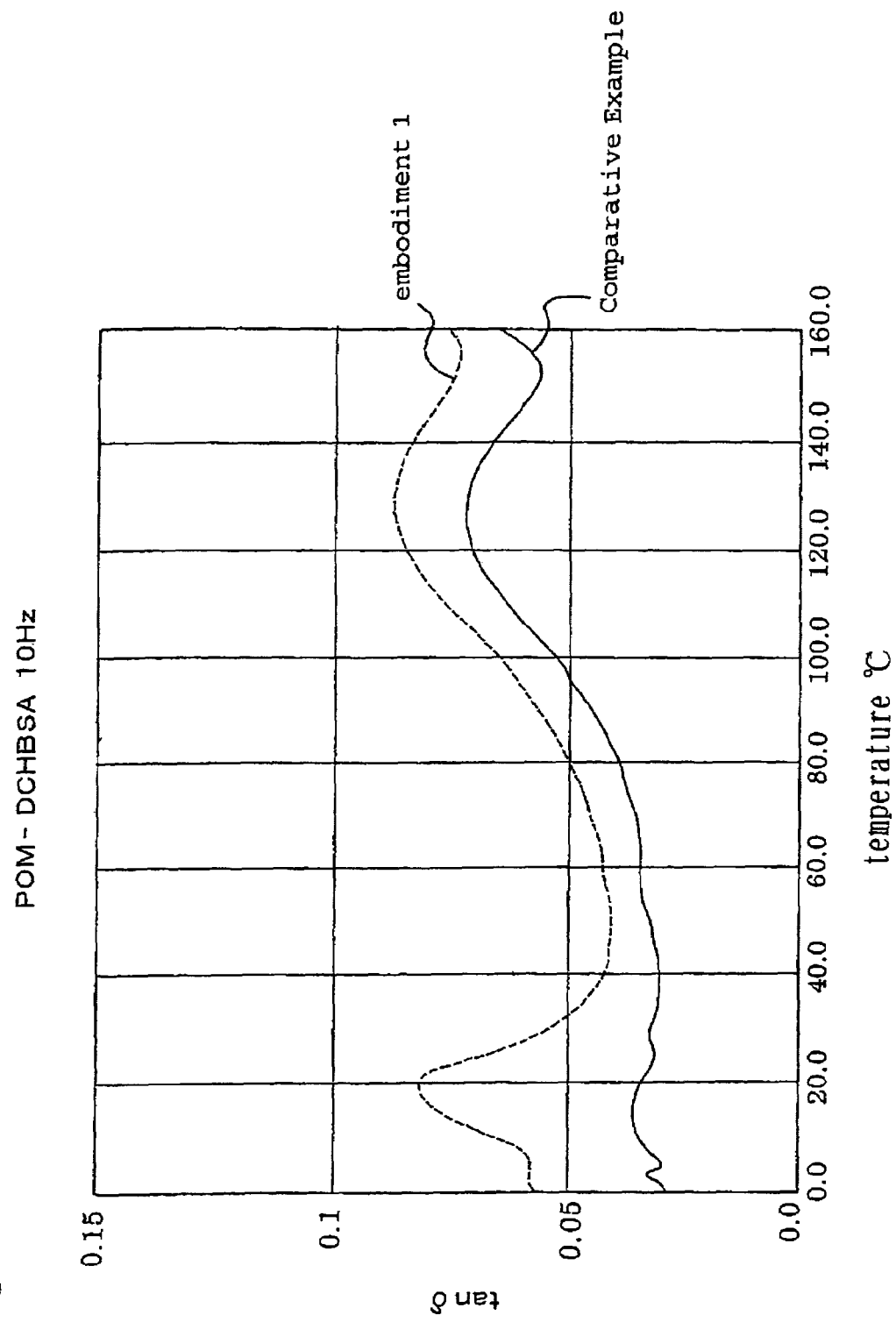
FIG. 1 is a graph showing the vibration-damping properties (tanS) of each of the vibration-damping engineering plastics in embodiment 1 and the Comparative Example.
Figure 2:
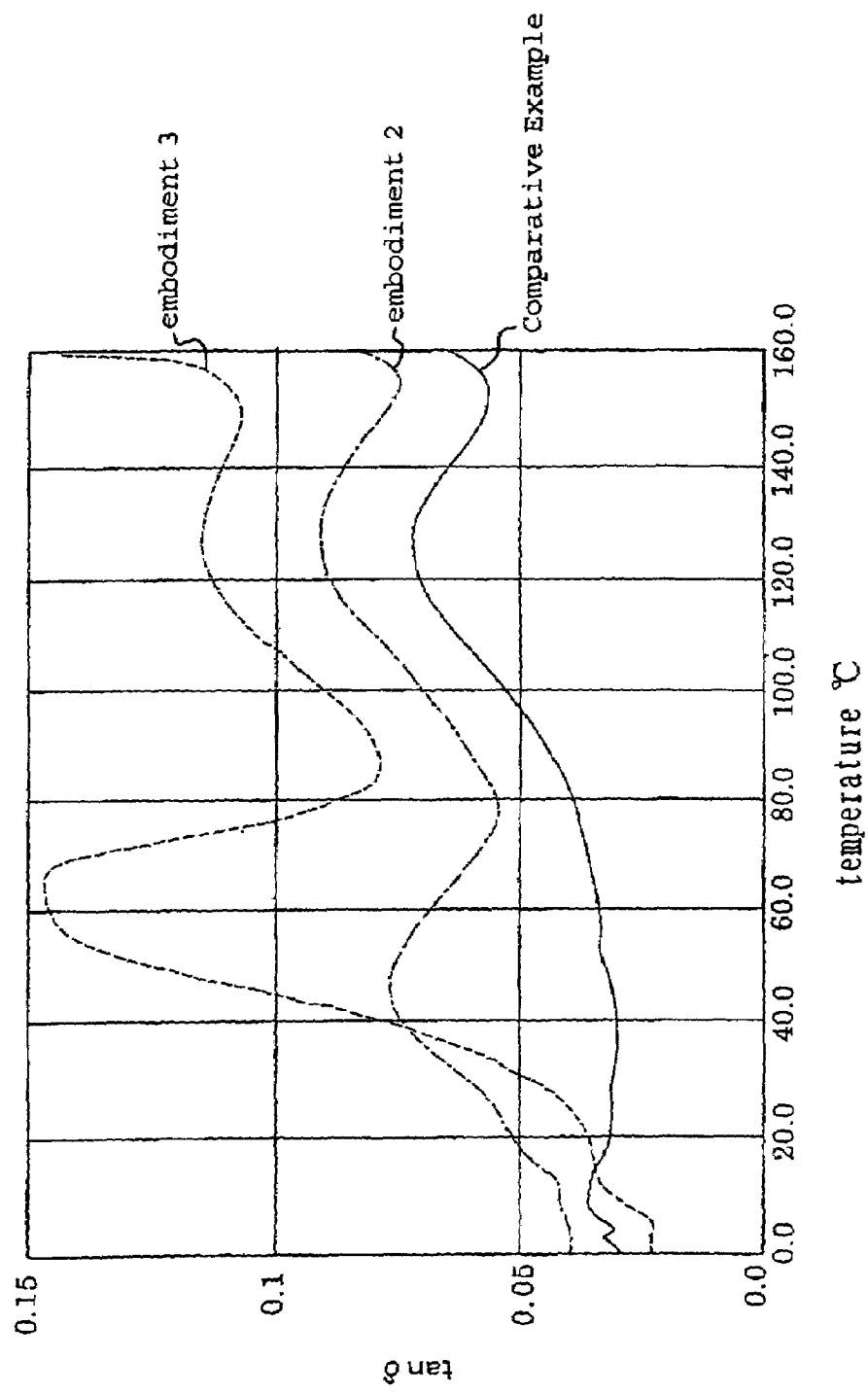
FIG. 2 is a graph showing the vibration-damping properties (tanS) of each of the vibration-damping engineering plastics in embodiment 2, 3 and the Comparative Example.
Figure 3:
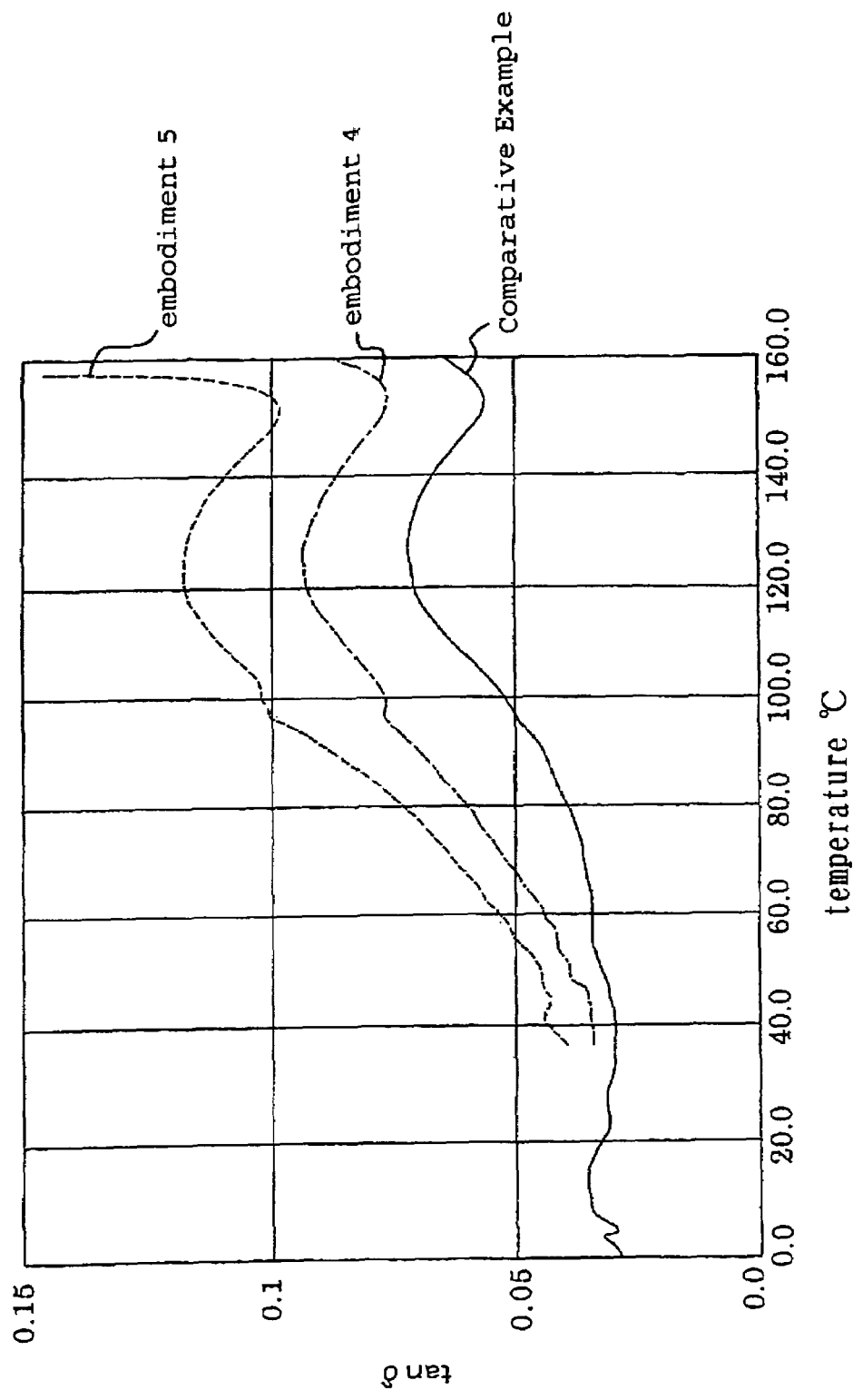
FIG. 3 is a graph showing the vibration-damping properties (tanS) of each of the vibration-damping engineering plastics in embodiment 4, 5 and the Comparative Example.

That is to say, in the vibration-damping engineering plastics, the organic vibration-damping agent, upon incorporation into the base polymer, will not sufficiently be compatible with the base polymer, and thus there appear vibration-damping performance (tanS) peaks of the base polymer and the vibration-damping agent respectively, which results in bringing about an effect of increasing the base of the vibration-damping performance (tanS) of the vibration-damping engineering plastics as a whole, as shown in FIGS. 1 to 3.

As the organic vibration-damping agent having such functions, mention can be made of a mixture of one or more compounds selected from the group consisting of:

a compound having a benzothiazyl group, such as N,N-dicyclohexyl benzothiazyl-2-sulfenamide (DCHBSA), 2-mercaptobenzothiazole (MBT), dibenzothiazyl sulf ide (MBTS), N-cyclohexylbenzothiazyl-2-sulfenamide (CBS), N-tert-butylbenzothiazyl-2-sulfenamide (BBS), N-oxydiethylenebenzothiazyl-2-sulfenamide (OBS) and N,N-diisopropylbenzothiazyl-2-sulfenamide (DPBS), a compound having a benzotriazole group, that is, a compound having, as a nucleus, benzotriazole having an azole group bound to a benzene ring with a phenyl group bound to the nucleus, such as 2-{2'-hydroxy-3'-(3",4",5",6"-tetrahydrophthalimidemethyl)-5'-methylphenyl}-benzotriazole (2HPMMB), 2-{2'-hydroxy-5'-methylphenyl}-benzotriazole (2HMPB), 2-{2'-hydroxy-3'-t-butyl-5'-methylphenyl}-5-chlorobenzotriazole (2HBMPCB) and 2-{2'-hydroxy-3',5', -di-t-butylphenyl}-5-chlorobenzotriazole (2HDBPCB), a compound having a diphenyl acrylate group, such as ethyl-2-cyano-3,3-diphenyl acrylate, and a compound having a benzophenone group, such as 2-hydroxy-4-methoxybenzophenone (HMBP) and 2-hydroxy-4-methoxybenzophenone-5-sulfonic acid (HMBPS).

A combination of the organic vibration-damping agents can also be used. In this case, the resulting vibration-damping engineering plastics are influenced by the types of the organic vibration-damping agents blended, thus shifting the vibration-damping performance (tan5) peak. Accordingly, the vibration-damping performance (tanS) peak can be controlled so as to shift to a temperature range required for applications and working conditions of the vibration-damping engineering plastics by blending two, three, four or more kinds of organic vibration-damping agents.

The amount of the organic vibration-damping agent blended is desirably in a ratio of 1-300 parts by weight to 100 parts by weight of the base polymer consisting of thermoplastic engineering plastics. The amount is preferably 5 to 300 parts, more preferably 10 to 100 parts by weight, based on 100 parts by weight of the base polymer. When the amount of the organic vibration-damping agent blended is for example lower than 1 part by weight, an effect of significantly improving vibration-damping performance is hardly achieved, while when the amount is higher than 300 parts by weight, the organic vibration-damping agent will not be sufficiently compatible with the base polymer, and the effect achieved by the vibration-damping agent higher than 300 parts by weight cannot be expected.

For the purpose of further improving the vibration-damping properties and strength of the vibration-damping engineering plastics of the present invention, the vibration-damping engineering plastics may be charged with inorganic fillers suchasmica flakes, glass flakes, calcium carbonate, barytes and precipitated barium sulfate.

Additives such as an antioxidant, a strengthening agent/reinforcing agent, an antistatic agent, a flame-retardant, a lubricant, a foaming agent and a coloring agent can also be suitably mixed with the vibration-damping engineering plastics in such a range that the vibration-damping properties and strength of the vibration-damping engineering plastics are not hindered.

The vibration-damping engineering plastics of the present invention are formed in various shapes such as plate, bar and sphere depending on applications and working conditions. The vibration-damping engineering plastics of the present invention can be laminated integrally with another material such as plate material or steel plate to give a composite material.

The vibration-damping engineering plastics of the present invention can be molded by a known method depending on applications and purposes.

EMBODIMENT

Embodiment 1

A composition consisting of 90.0 wt % POM (Tenack C/Copolymer 3510, manufactured by Asahi Chemical Industry Co., Ltd.) as the base polymer and 10.0 wt % DCHBSA (Sunseller DZ manufactured by SANSHIN CHEMICAL INDUSTRY Co., Ltd.) as the organic vibration-damping agent was kneaded with a roll kneader and then formed into a sheet of 1 mm in thickness by a press molding machine to obtain vibration-damping engineering plastics.

The dynamic viscoelasticity (tan5) at 10 Hz of the resulting vibration-damping engineering plastics was measured and shown in FIG. 1. Measurement of dynamic viscoelasticity (tan8) was conduced by using a dynamic viscoelasticity measuring instrument (Rheometric Scientific Solid Analyzer RSA-II manufactured by Rheometric Scientific Inc.).

Embodiment 2

Vibration-damping engineering plastics were obtained in the same manner as in embodiment 1 except that 10.0 wt %

2HPMMB (viosorb 590 manufactured by Kyodo Yakuhin) was blended as the organic vibration-damping agent.

The dynamic viscoelasticity (tanδ) at 10 Hz of the resulting vibration-damping engineering plastics was measured and shown in FIG. 2.

Embodiment 3

Vibration-damping engineering plastics were obtained in the same manner as in embodiment 1 except that 30.0 wt % 2HPMMB was blended as the organic vibration-damping agent.

The dynamic viscoelasticity (tanδ) at 10 Hz of the resulting vibration-damping engineering plastics was measured and shown in FIG. 2.

Embodiment 4

Vibration-damping engineering plastics were obtained in the same manner as in embodiment 1 except that 10.0 wt % ECDPA (viosorb 910 manufactured by Kyodo Yakuhin) was blended as the organic vibration-damping agent.

The dynamic viscoelasticity (tanδ) at 10 Hz of the resulting vibration-damping engineering plastics was measured and shown in FIG. 3.

Embodiment 5

Vibration-damping engineering plastics were obtained in the same manner as in embodiment 1 except that 30.0 wt % ECDPA was blended as the organic vibration-damping agent.

The dynamic viscoelasticity (tanδ) at 10 Hz of the resulting vibration-damping engineering plastics was measured and shown in FIG. 3.

COMPARATIVE EXAMPLE

Engineering plastics made of a single POM base polymer were produced for comparison, and the dynamic viscoelasticity (tanδ) at 10 Hz was measured in the same manner as in embodiment 1 to 5 and shown in FIGS. 1 to 3.

From FIGS. 1 to 3, it was confirmed that the vibration-damping engineering plastics having DCHBSA, 2HPMMB or ECDPA blended as the organic vibration-damping agent in embodiment 1 to 5 had an improved vibration-damping performance (tanδ) of 0.1 or more as compared with the tanδ (about 0.05) of the single POM not blended with any organic vibration-damping agent in the Comparative Example.

In embodiment 1 to 5 wherein the organic vibration-damping agent was incorporated into POM, there were two tanδ peaks of POM and the organic vibration-damping agent, and the base of tanδ of the vibration-damping engineering plastics was increased.

From the graphs of embodiment 2 and 4 or embodiment 3 and 5 wherein the amount of 2HPMMB or ECDPA compounded was changed from 10.0 wt % to 30.0 wt %, it was confirmed that the vibration-damping performance was improved with this increase in the compounding amount.

Effect of the Invention

As described above, the vibration-damping engineering plastics of the present invention comprise an organic vibration-damping agent incorporated into a base polymer consisting of thermoplastic engineering plastics, and thus have both high strength and excellent vibration-damping properties. Further, the vibration-damping engineering plastics exhibit an effect of increasing the base of vibration-damping performance of the vibration-damping engineering plastics as a whole.

Further, plural kinds of organic vibration-damping agents can be incorporated into the vibration-damping engineering plastics of the present invention, and in this case, the tanS peak can be controlled so as to shift to a temperature range required for applications and working conditions of the vibration-damping engineering plastics.

INDUSTRIAL APPLICABILITY

The vibration-damping engineering plastics of the present invention can be applied to a wide variety of fields, for example electronic equipments such as a cellular phone housing, a compact disk, a computer and a printer, electronic materials such as a circuit board, a print substrate, a CPU panel and an IC chip, household appliances such as a ventilation fan, a vacuum cleaner, a washing machine and a refrigerator, automobile/other transport instruments such as an instrument panel, an airbag cover, an airbag, a console box, a steering part, an electric part and a bumper, industrial machine parts such as a cum and a gear, precision instruments such as a stereo, a video tape player and a video camera, building materials such as an asphalt modifier, an eaves trough, and a unit bath, sporting/leisure goods such as a golf head, a surfboard, ski goods, a snowboard, a fishing tool and a helmet, and articles for daily use such as a container and a joint.

The present invention can be carried out arbitrarily in the scope of the claims without limitation to the Examples.

We claim:

1. A vibration damping engineering plastic comprising:
    (a) a base polymer comprising a thermoplastic engineering plastic, wherein the thermoplastic engineering plastic is polyacetal (POM); and
    (b) a vibration damping agent coupled with the base for accentuating the vibration damping performance wherein the vibration damping agent comprises a benzothiazyl group, a benzotriazole group, a diphenyl acrylate group or a benzophenone group, or combinations thereof.

2. A vibration damping engineering plastic according to claim 1, wherein the vibration damping agent is contained in a ratio of 1-300 parts by weight to 100 parts by weight of the base polymer.

* * * * *